United States Patent
Matsunaga et al.

(10) Patent No.: US 8,169,765 B2
(45) Date of Patent: May 1, 2012

(54) HIGH-SIDE DRIVER

(75) Inventors: Yasuyuki Matsunaga, Niiza (JP); Kiyokatsu Satoh, Niiza (JP); Koji Ebata, Hitachinaka (JP)

(73) Assignees: Sanken Electric Co., Ltd., Niiza-shi (JP); Hitachi, Ltd., Toyko (JP)

( * ) Notice: Subject to any disclaimer, the term of this patent is extended or adjusted under 35 U.S.C. 154(b) by 8 days.

(21) Appl. No.: 12/993,698

(22) PCT Filed: Apr. 27, 2009

(86) PCT No.: PCT/JP2009/058306
§ 371 (c)(1),
(2), (4) Date: Nov. 19, 2010

(87) PCT Pub. No.: WO2009/142100
PCT Pub. Date: Nov. 26, 2009

(65) Prior Publication Data
US 2011/0089919 A1    Apr. 21, 2011

(30) Foreign Application Priority Data
May 21, 2008  (JP) .................................. 2008-133328

(51) Int. Cl.
*H01H 9/00*    (2006.01)
(52) U.S. Cl. ........................................ 361/160; 361/152
(58) Field of Classification Search ................ 361/152, 361/160, 161, 170, 183, 191, 195, 206; 323/282, 323/284
See application file for complete search history.

(56) References Cited

U.S. PATENT DOCUMENTS

| | | | |
|---|---|---|---|
| 5,414,717 A * | 5/1995 | Matsumoto et al. | 714/748 |
| 2003/0197993 A1 | 10/2003 | Mirowski et al. | |
| 2005/0105239 A1 | 5/2005 | Satoh et al. | |
| 2006/0226704 A1 | 10/2006 | Tsuchiya | |
| 2007/0013361 A1 | 1/2007 | Burlak et al. | |
| 2008/0284404 A1 | 11/2008 | Burlak et al. | |

FOREIGN PATENT DOCUMENTS
EP    1 357 461 A2    10/2003
(Continued)

OTHER PUBLICATIONS

Extended European Search Report issued Jun. 21, 2011, in Patent Application No. 09750462.5. International Search Report issued Jun. 2, 2009 in PCT/JP09/58306 filed Apr. 27, 2009.

*Primary Examiner* — Jared Fureman
*Assistant Examiner* — Terrence Willoughby
(74) *Attorney, Agent, or Firm* — Oblon, Spivak, McClelland, Maier & Neustadt, L.L.P.

(57) ABSTRACT

A high-side driver has a semiconductor element being connected in series in a power supply path extending from a DC power source to a linear solenoid and turned on/off to control a current of the linear solenoid. The high-side driver includes a current detector of a current of the linear solenoid, a controller of the semiconductor element, a state detector of the high-side driver or the linear solenoid and output a state signal, a first transmit buffer to latch and output the state signal, a second transmit buffer to output the state signal without latching the same, and a transmit shift register to convert the state signal into serial data and transmit the serial data to an external device at predetermined timing. The state detector selects at least one of the first and second transmit buffers and outputs the state signal to the selected one.

6 Claims, 2 Drawing Sheets

FOREIGN PATENT DOCUMENTS

| | | |
|---|---|---|
| EP | 1 357 461 A3 | 10/2003 |
| EP | 1 739 833 A2 | 1/2007 |
| EP | 1 739 833 A3 | 1/2007 |
| JP | 2002 278632 | 9/2002 |
| JP | 2005 150550 | 6/2005 |
| JP | 2006 294694 | 10/2006 |
| JP | 2008 17611 | 1/2008 |

* cited by examiner

HIGH-SIDE DRIVER

TECHNICAL FIELD

The present invention relates to a high-side driver to drive a load such as a linear solenoid, and particularly, to a high-side driver having a serial communication function.

BACKGROUND TECHNOLOGY

To drive a solenoid, there has been used a solenoid drive circuit that passes a current with the use of a semiconductor element such as an FET (Field Effect Transistor). For example, a linear solenoid that applies a voltage to an exciting coil and generates a magnetic force to directly provide a movable iron core with linear motion is capable of linearly controlling hydraulic pressure in response to a control current provided by the solenoid drive circuit and is frequently used in, for example, a car electronics field.

For example, Japanese Unexamined Patent Application Publication No. 2005-150550 describes a solenoid drive apparatus that precisely controls a solenoid with good response. This solenoid drive apparatus includes a DC power source, a switching element and solenoid connected to the DC power source in series, a PWM signal generation circuit to provide a control terminal of the switching element with a control signal and control ON/OFF of the switching element, and a control circuit configured to output a solenoid current command value to the PWM signal generation circuit thereby control the PWM signal generation circuit. The control circuit includes a current detector to detect a current passing through the solenoid and output a voltage value corresponding to the detected current, an amplifier to amplify the voltage value detected by the current detector, an integrator to integrate the amplified output from the amplifier, an operational comparison circuit to compare the integrated value from the integrator held in a hold circuit with a solenoid current target value and output the comparison result as the solenoid current command value to the PWM signal generation circuit, and a reset circuit to reset the output of the integrator.

The PWM signal generation circuit provides the control terminal of the switching element with a control signal having a pulse width corresponding to the solenoid current command value from the operational comparison circuit and provides the reset circuit with a reset signal whenever providing the switching element with the control signal, to reset the output of the integrator in synchronization with the control signal. Since the reset circuit resets the output of the integrator to zero in synchronization with the control signal from the PWM signal generation circuit, the operational comparison circuit compares, at every cycle of the control signal from the PWM signal generation circuit, an integrated value of the integrator with a target current value and outputs a solenoid current command value to the PWM signal generation circuit.

Accordingly, the related art can precisely control the solenoid in response to a current passed to the solenoid and detected by the current detector. Even if the current detector detects a voltage value containing noise caused by, for example, the switching operation of a MOSFET, or a fluctuating voltage value caused by a sudden change in a power source voltage and even if the amplifier amplifies such a noise-containing voltage value, the integrator smoothes the noise in the output of the amplifier so that the noise may not cause a serious error. Due to this, there is no need of improving the accuracy of solenoid control by frequently conducting sampling at short intervals with the hold circuit. Namely, there will be no increase in the number of operations to increase operation load on the operational comparison circuit.

The solenoid drive apparatus of the above-mentioned document compares a solenoid current target value calculated from output signals of various sensors with a solenoid current detected value, and based on a result of the comparison, controls the PWM signal generation circuit. It will be possible to use, for example, an external microcomputer to set the target value. In this case, the external microcomputer is capable of not only setting the target value but also transmitting information about the functions and setting of the solenoid drive apparatus, and therefore, is convenient. In addition, the external microcomputer can receive state information, such as overvoltage information and overheat information, from the solenoid drive apparatus. Accordingly, the external microcomputer or an operator of the microcomputer may take a measure appropriate for a situation to quickly and flexibly deal with the situation.

To achieve such communication with the external microcomputer, serial communication is generally used. The serial communication uses a single signal line to transmit/receive a bit of data per a clock and has advantages that it employs a small number of signal lines and can conduct long-distance communication.

FIG. 1 is a block diagram illustrating a conventional transmission circuit 11 used for standard serial communication. A transmit buffer 25 receives IC internal data to be transmitted and outputs the data as parallel data to a shift register 23. The shift register 23 converts the parallel data from the transmit buffer 25 into a serial signal and outputs the signal at predetermined timing. At this time, to surely output the IC internal data to the shift register 23, the transmit buffer 25 latches the parallel data, and then, outputs the same. With this, data inputted to the transmit buffer 25 during a period from the preceding serial communication conducted by the shift register 23 to the next serial signal output by the shift register 23 can be transmitted from the transmit buffer 25 to the shift register 23 without omission.

DISCLOSURE OF INVENTION

The transmission circuit 11 of the related art of FIG. 1 has problems. As mentioned above, the shift register 23 conducts data writing by serial communication to an external device such as a microcomputer at predetermined timing. If an abnormal operation flag is sent as IC internal data to the transmit buffer 25, the transmit buffer 25 latches the abnormal operation flag until the next serial communication timing of the shift register 23, and then, outputs the same to the shift register 23. Even if the abnormal operation is solved before the next serial communication timing of the shift register 23, the transmit buffer 25 surely notifies the shift register 23 of the occurrence of the abnormal operation by outputting the abnormal operation flag to the shift register 23. As a result, although the abnormal operation has been solved, the shift register 23 transmits the occurrence of the abnormal operation to the external device such as a microcomputer by serial communication. If the external microcomputer is configured to carry out some control process in response to the abnormal operation, the microcomputer unnecessarily carries out the control process, to cause an overall processing delay.

If noise irrelevant to IC internal data is inputted to the transmit buffer 25, the transmit buffer 25 latches and outputs the noise, to cause an erroneous operation. However, if the transmit buffer 25 is configured not to latch input data, the transmit buffer 25 provides the shift register 23 with only data that is in the transmit buffer 25 at the serial communication timing of the shift register 23. Then, necessary data will not be always transferred to the shift register 23.

The present invention solves the above-mentioned problems of the related art and provides a high-side driver that prevents a processing delay due to an output latching operation of a transmit buffer and surely transmits necessary data by serial communication.

MEANS TO SOLVE THE PROBLEMS

To solve the above-mentioned problems, the high-side driver according to the present invention has a semiconductor element that is connected in series in a power supply path extending from a DC power source to a load and is turned on/off to control a current passing through the load. The high-side driver includes a current detector to detect a current passing through the load, a controller to control ON/OFF of the semiconductor element according to the current detected by the current detector, a state detector to detect a state of the high-side driver or a state of the load and output a state signal, a first transmit buffer to latch and output the state signal from the state detector, a second transmit buffer to output the state signal from the state detector without latching the same, and a transmit shift register to convert the state signal from the first or second transmit buffer into serial data and transmit the serial data to an external device at predetermined timing. The state detector selects at least one of the first and second transmit buffers according to the detected state and outputs the state signal to the selected one.

MODE OF IMPLEMENTING INVENTION

A high-side driver according to an embodiment of the present invention will be explained in detail with reference to the drawings.

Figure 1:
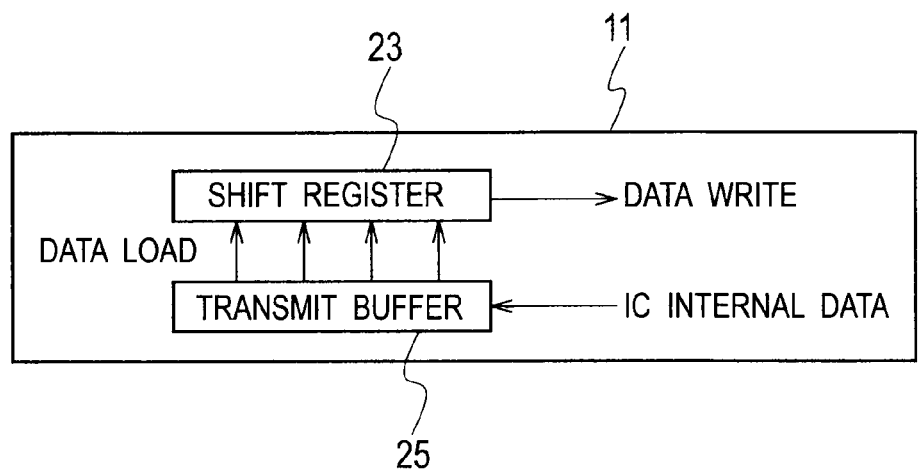
FIG. 1 is a block diagram illustrating a serial communication transmission circuit used for a high-side driver according to a related art.
Figure 2:
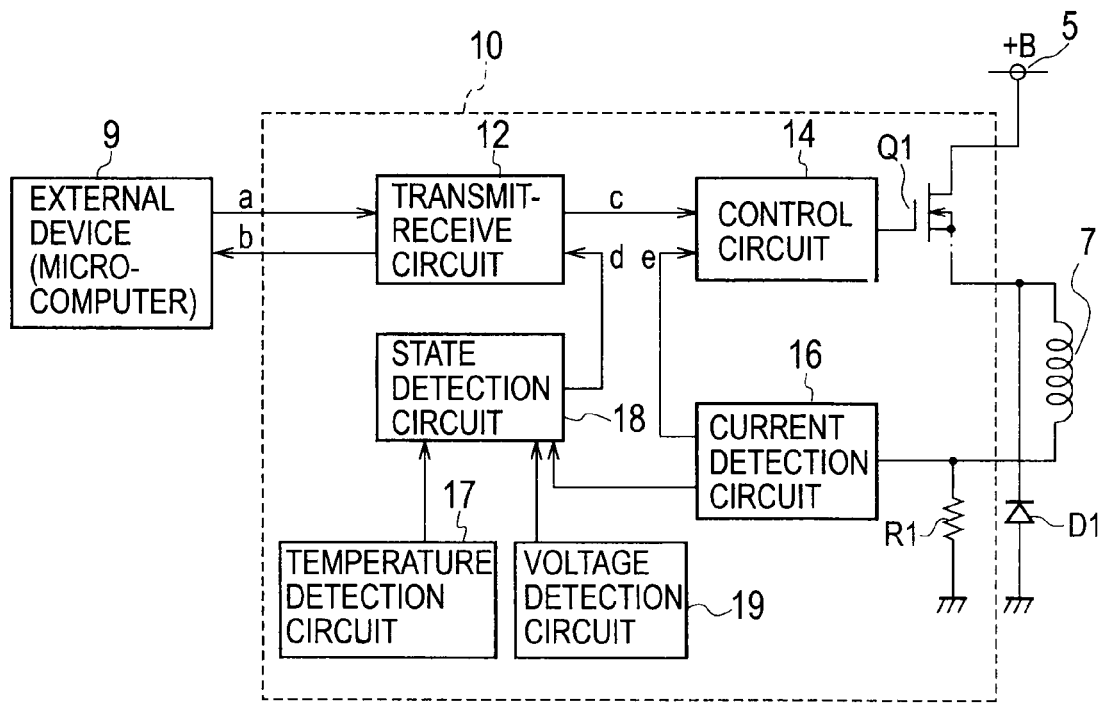
FIG. 2 is a block diagram illustrating a high-side driver according to an embodiment of the present invention.
Figure 3:
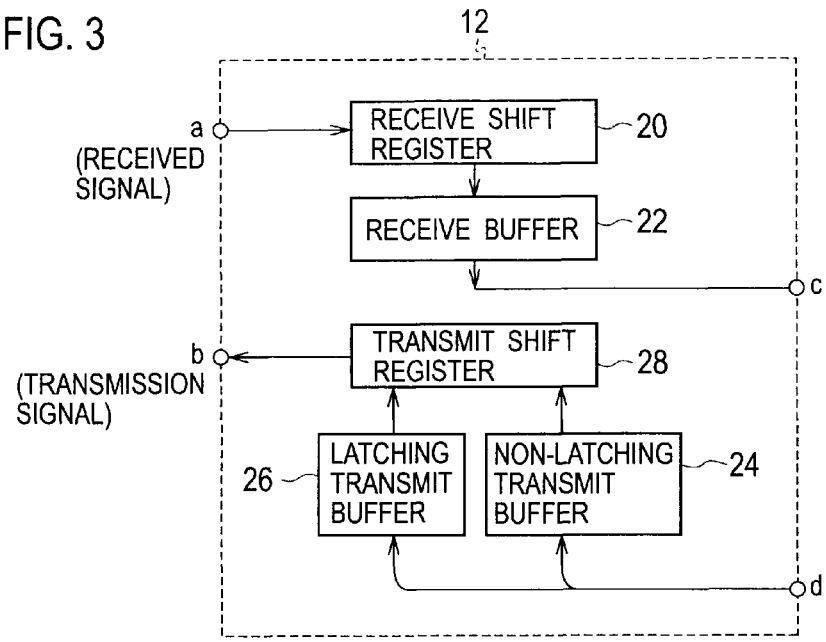
FIG. 3 is a block diagram illustrating a transmit-receive circuit of the high-side driver according to the embodiment of the present invention.

The embodiment of the present invention will be explained by referring to the drawings. FIG. 2 is a block diagram illustrating the high-side driver 10 according to the embodiment. FIG. 3 is a block diagram illustrating the details of a transmit-receive circuit 12 of the high-side driver 10 illustrated in FIG. 2.

A configuration of the embodiment will be explained. As illustrated in FIG. 2, the high-side driver 10 has a semiconductor element Q1, a resistor R1, a DC power source 5, a transmit-receive circuit 12, a control circuit 14, a current detection circuit 16, a temperature detection circuit 17, a state detection circuit 18, and a voltage detection circuit 19 and drives a linear solenoid 7 serving as a load. A circulation diode D1 is connected between a first end of the linear solenoid 7 (on the source side of the semiconductor element Q1) and the ground, to prevent a counter electromotive voltage from occurring at both ends of the linear solenoid 7.

The transmit-receive circuit 12 is connected to an external device 9 such as a microcomputer and is capable of conducting serial communication to transmit and receive data to and from the external device 9.

The semiconductor element Q1 serves as a switch, is generally an FET, is connected in series in a power supply path extending from the DC power source 5 to the linear solenoid 7, i.e., the load, and is turned on/off to control a current passing through the linear solenoid 7. The semiconductor element Q1 may be a bipolar transistor.

The current detection circuit 16 corresponds to a current detection part (a current detector) of the present invention and detects a current passing through the linear solenoid 7. In practice, the resistor R1 is connected in series between the linear solenoid 7 and the ground and the current detection circuit 16 calculates a current passing through the linear solenoid 7 based on a voltage across the resistor R1. According to the embodiment, the resistor R1 is arranged inside the high-side driver 10. It may be arranged outside the high-side driver 10.

The control circuit 14 corresponds to a control part (a controller) of the present invention and conducts, based on the current detected by the current detection circuit 16, PWM control of ON/OFF of the semiconductor element Q1. For example, the control circuit 14 stores a target current value to that passing through the linear solenoid 7, compares the target current value with the current detected by the current detection circuit 16, and controls the semiconductor element Q1 to bring the current passing through the linear solenoid 7 closer to the target current value. The semiconductor element Q1 is used as a high-side switch. Accordingly, the control circuit 14 is imperative for turning on the semiconductor element Q1 and outputs a voltage higher than an output voltage of the DC power source 5 to a gate of the semiconductor element Q1, thereby controlling the semiconductor element Q1.

The state detection circuit 18 corresponds to a state detection part (a state detector) of the present invention, detects a state of the high-side driver 10 or a state of the solenoid 7, and outputs a state signal. The high-side driver 10 involves various states, and for example, a temperature state of the high-side driver 10 is used as the state of the high-side driver 10. Also, the linear solenoid 7 involves various states, and for example, a passing current state or an applied voltage state of the linear solenoid 7 is used as the state of the solenoid 7.

The temperature detection circuit 17 corresponds to a temperature detection part (a temperature detector) of the present invention, detects a temperature of the high-side driver 10, and outputs the detected temperature to the state detection circuit 18. The temperature detection circuit 17 is, for example, a temperature sensor and is set to measure the temperature of a location inside the high-side driver 10 where temperature easily increases, or where heat resistance is low.

The voltage detection circuit 19 corresponds to a voltage detection part (a voltage detector) of the present invention, detects an output voltage of the DC power source 5 or a voltage applied to the linear solenoid 7, and outputs the detected voltage to the state detection circuit 18.

According to the present embodiment, the voltage detection circuit 19 detects only the output voltage of the DC power source 5. Accordingly, although wiring is not illustrated in FIG. 2, the voltage detection circuit 19 detects a voltage applied between an output terminal of the DC power source 5 (on the drain side of the semiconductor element Q1) and the ground. When the voltage detection circuit 19 is to detect a voltage applied to the linear solenoid 7, it detects a voltage applied to both ends of the linear solenoid 7.

The temperature detection circuit 17 and voltage detection circuit 19 are not always required for realizing the present invention and play supplementary roles when the state detection circuit 18 detects the states of the high-side driver 10 and linear solenoid 7. The high-side driver 10 may employ another configuration to detect the states of the high-side driver 10 and linear solenoid 7. The state detection circuit 18 may include a sensor to detect, for example, the state of the high-side driver 10 or the state of the linear solenoid 7.

According to the present embodiment, the state detection circuit 18 selects, based on a detected state, at least one of a non-latching transmit buffer 24 and a latching transmit buffer 26 and outputs a state signal to the selected one. Accordingly, the state detection circuit 18 detects, based on the temperature detected by the temperature detection circuit 17, that the temperature of the high-side driver 10 is in an overheat state, selects at least one of the non-latching transmit buffer 24 and latching transmit buffer 26, and outputs a state signal indicating the overheat state to the selected one. The non-latching transmit buffer 24 and latching transmit buffer 26 will be explained later.

For example, the state detection circuit 18 has reference temperature data, and if the temperature detected by the temperature detection circuit 17 is above the reference temperature, outputs a state signal indicating the overheat state. Instead of the state detection circuit 18, the temperature detection circuit 17 may determine whether or not it is an overheat state. Instead of whether or not it is an overheat state, the state detection circuit 18 may output the temperature data from the temperature detection circuit 17 as it is as a state signal.

The state detection circuit 18 also detects, based on the voltage detected by the voltage detection circuit 19, that an output voltage of the DC power source 5 or a voltage applied to the linear solenoid 7 is in an overvoltage state, selects at least one of the non-latching transmit buffer 24 and latching transmit buffer 26, and outputs a state signal indicating the overvoltage state to the selected one.

According to the present embodiment, the voltage detection circuit 19 detects only the output voltage of the DC power source 5, and therefore, the state detection circuit 18 detects that the output voltage of the DC power source 5 is in an overvoltage state based on the voltage detected by the voltage detection circuit 19. Instead of the state detection circuit 18, the voltage detection circuit 19 may determine whether or not it is an overvoltage state. Instead of detecting whether or not it is an overvoltage state, the state detection circuit 18 may output the voltage data from the voltage detection circuit 19 as it is as a state signal.

Also, the state detection circuit 18 selects at least one of the non-latching transmit buffer 24 and latching transmit buffer 26, and based on the current detected by the current detection circuit 16, outputs to the selected one a state signal indicating a current state of the linear solenoid 7.

As illustrated in FIG. 3, the transmit-receive circuit 12 has a receive shift register 20, a receive buffer 22, a transmit shift register 28, the non-latching transmit buffer 24, and the latching transmit buffer 26.

The receive shift register 20 receives serial data transmitted by the external device 9, converts the same into parallel data, and outputs the parallel data to the receive buffer 22. The serial data transmitted by the external device 9 is, for example, data to change the setting and function of the high-side driver 10.

Based on the parallel data outputted from the receive shift register 20, the receive buffer 22 outputs a set signal to change the setting or function of the high-side driver 10. As an example, the receive buffer 22 outputs, as the set signal, a target current value of the linear solenoid 7. In this case, the control circuit 14 sets the target current value based on the set signal outputted from the receive buffer 22, compares the current detected by the current detection circuit 16 with the target current value, and controls ON/OFF of the semiconductor element Q1.

The latching transmit buffer 26 corresponds to a first transmit buffer of the present invention and outputs the state signal outputted from the state detection circuit 18 after latching the same.

The non-latching transmit buffer 24 corresponds to a second transmit buffer of the present invention and outputs the state signal outputted from the state detection circuit 18 without latching the same.

The transmit shift register 28 converts the state signal outputted from the latching transmit buffer 26 or from the non-latching transmit buffer 24 into serial data, and at predetermined timing, transmits the serial data to the external device 9. At the time of serial data conversion, the transmit shift register 28 forms frame data by assigning a specific bit to the inputted state signal, and at predetermined timing, transmits the frame data. For example, a specific bit among the frame data is a bit related to an overheat state and the bit is set if it is an overheat state. Another specific bit among the frame data is a bit related to an overvoltage and the bit is set if it is an overvoltage state. The transmit shift register 28 may employ a plurality of bits to convert a current value into serial data. The timing when the transmit shift register 28 conducts serial transmission is determined by, for example, the external device 9.

The present invention is achievable without regard to the type of an interface used for serial communication. For example, a three-wire synchronous communication interface called SPI (Serial Peripheral Interface) is employed. The SPI communication simultaneously carries out transmission and reception and operates to change the contents of a master and slave by simultaneously conducting transmission and reception with the use of one shift register. When the SPI communication is adopted for the present invention, there is no need of separately preparing the receive shift register 20 and transmit shift register 28 as illustrated in FIG. 3. Instead, the transmit-receive circuit 12 may have one shift register having transmission and reception functions.

Like the transmit buffer 25 of the related art, the latching transmit buffer 26 latches a state signal inputted to the latching transmit buffer 26 until the next serial communication timing of the transmit shift register 28, and then, outputs the state signal to the transmit shift register 28.

Unlike the latching transmit buffer 26, the non-latching transmit buffer 24 outputs the state signal outputted from the state detection circuit 18 as it is to the transmit shift register 28 without latching the same. Accordingly, even if a state signal is once inputted into the non-latching transmit buffer 24, it outputs no state signal to the transmit shift register 28 if no state signal is inputted into the non-latching transmit buffer 24 at the serial communication timing of the transmit shift register 28.

Operation of the embodiment with the above-mentioned configuration will be explained. The control circuit 14 controls ON/OFF of the semiconductor element Q1 based on a current detected by the current detection circuit 16. For example, the control circuit 14 beforehand stores a target current value of the linear solenoid 7, or receives through the transmit-receive circuit 12 the target current value from the external device 9 by serial communication, compares the target current value with the current detected by the current detection circuit 16, and controls the semiconductor element Q1 in such a way as to bring the current passing through the linear solenoid 7 closer to the target current value.

When the semiconductor element Q1 turns on, a current is supplied from the DC power source 5 to the linear solenoid 7 and passes through the resistor R1 to the ground. The current detection circuit 16 detects, based on a voltage across the resistor R1, the current passing through the linear solenoid 7 and outputs the detected current value to the control circuit 14 and state detection circuit 18.

The temperature detection circuit 17 detects a temperature of the high-side driver 10 and outputs the detected temperature to the state detection circuit 18. The voltage detection circuit 19 detects an output voltage of the DC power source 5 and outputs the detected voltage to the state detection circuit 18.

The state detection circuit 18 detects a state of the high-side driver 10 or a state of the linear solenoid 7 and outputs a state signal. According to the embodiment, the state detection circuit 18 outputs a state signal related to the current value of the linear solenoid 7 detected by the current detection circuit 16, a state signal related to the temperature of the high-side driver 10 detected by the temperature detection circuit 17, and a state signal related to the output voltage of the DC power source 5 detected by the voltage detection circuit 19.

In FIG. 2, a single line is symbolically depicted from the state detection circuit 18 to the transmit-receive circuit 12. In practice, the state detection circuit 18 may use a plurality of lines to output the plurality of state signals mentioned above in parallel to the transmit-receive circuit 12. At this time, the state detection circuit 18 may select, depending on the kinds of the state signals, at least one of the non-latching transmit buffer 24 and latching transmit buffer 26 and outputs the state signals to the selected one.

Figure 4:
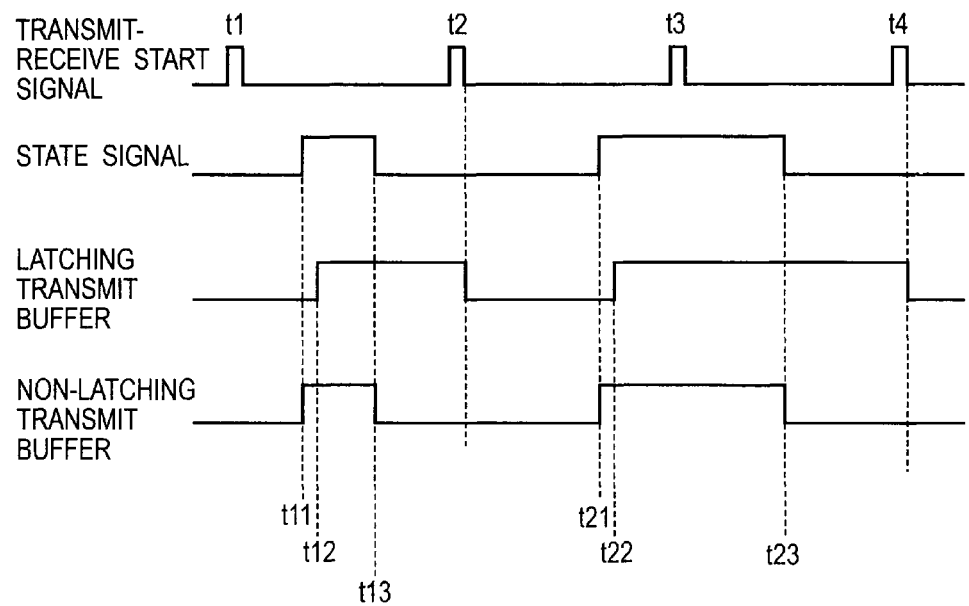
FIG. 4 is a timing chart illustrating operation of the high-side driver according to the embodiment of the present invention.

FIG. 4 is a timing chart illustrating operation of the high-side driver 10 according to the embodiment. At time t1, t2, t3, and t4 of FIG. 4, the external device 9 outputs a transmit-receive start signal to the transmit-receive circuit 12. Just after receiving the transmit-receive start signal from the external device 9, the receive shift register 20 and transmit shift register 28 in the transmit-receive circuit 12 start to carry out reception and transmission, respectively. Output timing of the transmit-receive start signal from the external device 9 is optional and is not always at regular intervals.

At time t11, the state detection circuit 18 outputs a high (H)-level state signal to the transmit-receive circuit 12. The state detection circuit 18 can select at least one of the non-latching transmit buffer 24 and latching transmit buffer 26 and output the state signal to the selected one. In this example, the state signal is outputted to both of them.

The non-latching transmit buffer 24 outputs, at time t11, the state signal as it is to the transmit shift register 28. On the other hand, the latching transmit buffer 26 outputs, after a small delay (time t12), the state signal to the transmit shift register 28. This time delay occurs because the latching transmit buffer 26 samples the state signal inputted in synchronization with a clock.

At time t13, the state detection circuit 18 outputs a low (L)-level state signal. The non-latching transmit buffer 24 outputs the low-level state signal as it is to the transmit shift register 28. On the other hand, the latching transmit buffer 26 latches the state signal until the next serial communication timing (time t2), and then, outputs the state signal. Accordingly, the latching transmit buffer 26 outputs, even at time t13, the high-level state signal to the transmit shift register 28.

At time t2, the transmit shift register 28 converts the state signal outputted from the latching transmit buffer 26 or the state signal from the non-latching transmit buffer 24 into serial data and transmits the serial data to the external device 9 by serial communication. Here, the state signal outputted from the latching transmit buffer 26 is high and the state signal outputted from the non-latching transmit buffer 24 is low. The latching transmit buffer 26 unlatches as soon as the transmit shift register 28 conducts the serial communication.

At time t21, the state detection circuit 18 outputs a high-level state signal to the transmit-receive circuit 12. The non-latching transmit buffer 24 outputs, at time t21, the state signal as it is to the transmit shift register 28. On the other hand, the latching transmit buffer 26 outputs, after a small delay (time t22), the state signal to the transmit shift register 28.

At time t3, the transmit shift register 28 converts the state signal outputted from the latching transmit buffer 26 or the state signal from the non-latching transmit buffer 24 into serial data and transmits the serial data to the external device 9 by serial communication. At time t3, the state signal outputted from the state detection circuit 18 is high, and therefore, the state signal outputted from the latching transmit buffer 26 and the state signal outputted from the non-latching transmit buffer 24 each are high. The latching transmit buffer 26 generally unlatches as soon as the transmit shift register 28 conducts the serial communication (time t3). Since the state signal outputted from the state detection circuit 18 is high at time t3, the latching transmit buffer 26 conducts no unlatching operation and continuously outputs the high-level state signal to the transmit shift register 28.

At time t23, the state detection circuit 18 outputs a low-level state signal. The non-latching transmit buffer 24 outputs the low-level state signal as it is to the transmit shift register 28. On the other hand, the latching transmit buffer 26 latches the state signal until the next serial communication timing (time t4), and then, outputs the state signal. Accordingly, the latching transmit buffer 26 outputs, even at time t23, the high-level state signal to the transmit shift register 28.

At time t4, the transmit shift register 28 converts the state signal outputted from the latching transmit buffer 26 or the state signal from the non-latching transmit buffer 24 into serial data and transmits the serial data to the external device 9 by serial communication. At this moment, the state signal outputted from the latching transmit buffer 26 is high and the state signal outputted from the non-latching transmit buffer 24 is low. The latching transmit buffer 26 unlatches as soon as the transmit shift register 28 conducts the serial communication.

As an example, an assumption is made that the state signal outputted from the state detection circuit 18 is a signal indicating an overvoltage state. At time t11 of FIG. 4, the state detection circuit 18 outputs the high-level state signal (overvoltage state) to the transmit-receive circuit 12. At time t13, the state detection circuit 18 outputs a low-level state signal to the transmit-receive circuit 12. Namely, at time t13 or t2, the overvoltage state has been solved. If there is only the latching transmit buffer 26 like the related art, the transmit shift register 28 outputs, based on the state signal outputted from the latching transmit buffer 26, serial data indicating the overvoltage state to the external device 9 by serial communication at time t2. Similarly at time t4 when the overvoltage state has been solved, the transmit shift register 28 outputs serial data indicating the overvoltage state to the external device 9 by serial communication at time t4.

If this happens, the transmit-receive circuit 12 is unable to inform the external device 9 of a correct state at the moment. If the external device 9 is set to output, in response to the overvoltage state, a stop signal to stop operation of the control circuit 14 in the high-side driver 10, the external device 9 will output the stop signal to the transmit-receive circuit 12 by serial communication, although there is no overvoltage state. Then, the high-side driver 10 must carry out unnecessary operation, to more or less delay overall operation. There is another possibility that the latching transmit buffer 26 provides an incorrect output based on spike noise that is irrelevant to an overvoltage.

This problem will not occur if the state detection circuit 18 selects the non-latching transmit buffer 24 and outputs the overvoltage state signal thereto. Then, the transmit shift register 28 will always output a correct state signal to the external device 9 by serial communication.

In connection with a hazardous state that must be dealt with, the state detection circuit 18 may select the latching transmit buffer 26. For example, the state detection circuit 18 outputs a state signal representative of an overheat state by selecting the latching transmit buffer 26. Even if the temperature momentarily drops during serial communication, the transmit shift register 28 outputs serial data indicating the overheat state to the external device 9 by serial communication.

The overheat state hardly returns to a normal temperature state and has a risk of causing various faults and malfunctions. Accordingly, it must quickly be dealt with. If the latching transmit buffer 26 receives an overheat state signal at least once, it latches the output thereof, so that the transmit shift register 28 may output serial data indicating that the high-side driver 10 is in a dangerous overheat state to the external device 9, so that the external device 9 may take a quick action (for example, stopping operation of the high-side driver 10).

The state detection circuit 18 may select both the non-latching transmit buffer 24 and latching transmit buffer 26 and outputs state signals. In this case, the transmit shift register 28 can output serial data representative of three kinds of information for a given state. The three kinds of information will be explained.

1. The state has been experienced once and is continuing at present.

In this case, the latching transmit buffer 26 provides a high-level output and the non-latching transmit buffer 24 provides a high-level output at the time of serial communication.

2. The state has been experienced once but a normal state has been restored at present.

In this case, the latching transmit buffer 26 provides a high-level output and the non-latching transmit buffer 24 provides a low-level output at the time of serial communication.

3. The state has not been experienced before and a normal state is continuing.

In this case, the latching transmit buffer 26 provides a low-level output and the non-latching transmit buffer 24 provides a low-level output at the time of serial communication.

There will never occur that the latching transmit buffer 26 provides a low-level output and the non-latching transmit buffer 24 provides a high-level output at the time of serial communication. Accordingly, four kinds of information will never occur. Depending on the above-mentioned three kinds of information, the external device 9 outputs serial data to the transmit-receive circuit 12, to properly change the function and setting of the high-side driver 10.

As mentioned above, the high-side driver according to the embodiment of the present invention has the latching transmit buffer 26 and the non-latching transmit buffer 24, to prevent a processing delay that may occur when the latching transmit buffer 26 latches an output, as well as reducing an unnecessary processing operation to be carried out by the external device 9. When an abnormal state is solved to restore a normal state, the external device 9 can instantaneously start the next control without wasting a control cycle, thereby realizing high-speed response.

The state detection circuit 18 selects at least one of the latching transmit buffer 26 and non-latching transmit buffer 24 and outputs a state signal to the selected one. Therefore, necessary data can surely be transmitted by serial communication at proper timing.

With the use of the receive shift register 20 and receive buffer 22, it is possible to receive serial data from the external device 9, and based on the serial data, change the setting and function of the high-side driver 10. If the external device 9 outputs a target current value through serial communication, the receive buffer 22 outputs, as a set signal, the target current value to be passed to the linear solenoid 7. Based on the set signal outputted from the receive buffer 22, the control circuit 14 sets the target current value, compares a current detected by the current detection circuit 16 with the target current value, and controls ON/OFF of the semiconductor element Q1. Accordingly, the external device 9 can easily control the current.

With the voltage detection circuit 19, it is possible to speedily cope with an overvoltage state of the DC power source 5. In particular, when the state detection circuit 18 selects the non-latching transmit buffer 24 and outputs a state signal indicative of the overvoltage state to the selected buffer, the transmit shift register 28 can always output latest information related to the overvoltage state to the external device 9 by serial communication. Accordingly, the external device 9 can quickly take a countermeasure.

With the temperature detection circuit 17, it is possible to immediately deal with an overheat state of the high-side driver 10. In particular, when the state detection circuit 18 selects the latching transmit buffer 26 and outputs a state signal indicative of the overheat state to the selected buffer, the transmit shift register 28 can output information related to the overheat state to the external device 9 by serial communication when the overheat state is experienced at least once. Accordingly, the external device 9 can quickly take a countermeasure.

The state detection circuit 18 provides the transmit-receive circuit 12 with a current state based on a current detected by the current detection circuit 16. This enables the external device 9 to monitor the state of a current passing through the linear solenoid 7.

The state signal outputted from the state detection circuit 18 is not limited to a signal related to the state of temperature, current, or voltage. It is possible to use the state signal to represent any state related to the high-side driver 10 and linear solenoid 7.

Effect of Invention

The present invention is capable of preventing a processing delay that may occur when a transmit buffer latches an output and surely transmitting necessary data by serial communication without omission.

Industrial Applicability

The high-side driver according to the present invention is applicable to drive a load such as a linear solenoid and is usable as a high-side driver that achieves serial communication with an external device such as a microcomputer.

(United States Designation)

In connection with United States designation, this international patent application claims benefit of priority under 35 U.S.C. 119(a) to Japanese Patent Application No. 2008-

133328 filed on May 21, 2008, the entire contents of which are incorporated by reference herein.

The invention claimed is:

1. A high-side driver having a semiconductor element that is connected in series in a power supply path extending from a DC power source to a load and is turned on/off to control a current passing through the load, the high-side driver comprising:
    a current detector detecting a current passing through the load;
    a controller configured to control ON/OFF of the semiconductor element based on the current detected by the current detector;
    a state detector configured to detect a state of the high-side driver or a state of the load and output a state signal;
    a first transmit buffer configured to latch and output the state signal of the state detector;
    a second transmit buffer configured to output the state signal of the state detector without latching the same; and
    a transmit shift register configured to convert the state signal of the first or second transmit buffer into serial data and transmit the serial data to an external device at predetermined timing, wherein
    the state detector selects, based on the detected state, at least one of the first and second transmit buffers and outputs the state signal to the selected one.

2. The high-side driver according to claim 1, comprising:
    a receive shift register configured to receive serial data transmitted from the external device, convert the serial data into parallel data, and output the parallel data; and
    a receive buffer configured to output a set signal to change the setting or function of the high-side driver based on the parallel data of the receive shift register.

3. The high-side driver according to claim 2, wherein
    the controller sets a target current value based on the set signal of the receive buffer, compares the current value detected by the current detector with the target current value, and controls ON/OFF of the semiconductor element.

4. The high-side driver according to claim 1, comprising:
    a voltage detector configured to detect an output voltage of the DC power source or a voltage applied to the load, wherein
    the state detector detects, based on the voltage detected by the voltage detector, an overvoltage state of the DC power source or the load,
    selects at least one of the first and second transmit buffers, and
    outputs a state signal indicative of the overvoltage state to the selected one.

5. The high-side driver according to claim 1, comprising
    a temperature detector configured to detect a temperature of the high-side driver, wherein
    the state detector detects, based on the temperature detected by the temperature detector, an overheat state of the high-side driver,
    selects at least one of the first and second transmit buffers, and
    outputs a state signal indicative of the overheat state to the selected one.

6. The high-side driver according to claim 1, wherein
    the state detector selects at least one of the first and second transmit buffers, and based on the current detected by the current detector, outputs a state signal indicative of a current state of the current of the load to the selected one.

* * * * *